(12) United States Patent
Kong et al.

(10) Patent No.: US 9,627,216 B2
(45) Date of Patent: Apr. 18, 2017

(54) METHOD FOR FORMING FEATURES IN A SILICON CONTAINING LAYER

(71) Applicant: APPLIED MATERIALS, INC., Santa Clara, CA (US)

(72) Inventors: Byungkook Kong, San Ramon, CA (US); Hoon Sang Lee, Hwasung (KR); Jinsu Kim, Kyung-Ki-Do (KR); Ho Jeong Kim, San Jose, CA (US); Xiaosong Ji, Milpitas, CA (US); Hun Sang Kim, San Ramon, CA (US); Jinhan Choi, San Ramon, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 95 days.

(21) Appl. No.: 14/506,208

(22) Filed: Oct. 3, 2014

(65) Prior Publication Data

US 2015/0099345 A1    Apr. 9, 2015

Related U.S. Application Data

(60) Provisional application No. 61/887,046, filed on Oct. 4, 2013.

(51) Int. Cl.
*H01L 21/3065* (2006.01)
*H01L 21/762* (2006.01)
*H01L 21/67* (2006.01)

(52) U.S. Cl.
CPC .... *H01L 21/3065* (2013.01); *H01L 21/30655* (2013.01); *H01L 21/67253* (2013.01); *H01L 21/76224* (2013.01)

(58) Field of Classification Search
CPC .................................................. H01L 21/3065
See application file for complete search history.

(56) References Cited

U.S. PATENT DOCUMENTS

| | | | |
|---|---|---|---|
| 6,277,752 B1 * | 8/2001 | Chen | 438/692 |
| 6,784,108 B1 | 8/2004 | Donohoe et al. | |
| 2009/0142902 A1 * | 6/2009 | Subramanian | 438/424 |
| 2009/0170333 A1 * | 7/2009 | Sasano | 438/710 |

(Continued)

FOREIGN PATENT DOCUMENTS

WO    WO 2012058377    5/2012

*Primary Examiner* — Daniel Whalen
*Assistant Examiner* — Suberr Chi
(74) *Attorney, Agent, or Firm* — Moser Taboada; Alan Taboada

(57) ABSTRACT

Embodiments of methods for forming features in a silicon containing layer of a substrate disposed on a substrate support are provided herein. In some embodiments, a method for forming features in a silicon containing layer of a substrate disposed on a substrate support in a processing volume of a process chamber includes: exposing the substrate to a first plasma formed from a first process gas while providing a bias power to the substrate support, wherein the first process gas comprises one or more of a chlorine-containing gas or a bromine containing gas; and exposing the substrate to a second plasma formed from a second process gas while no bias power is provided to the substrate support, wherein the second process gas comprises one or more of an oxygen-containing gas or nitrogen gas, and wherein a source power provided to form the first plasma and the second plasma is continuously provided.

20 Claims, 4 Drawing Sheets

(56) References Cited

U.S. PATENT DOCUMENTS

2010/0136797 A1* 6/2010 Kabe ................. H01L 21/02238
            438/772
2014/0186544 A1* 7/2014 Hua ................... H01L 21/0217
            427/534

* cited by examiner

METHOD FOR FORMING FEATURES IN A SILICON CONTAINING LAYER

CROSS-REFERENCE TO RELATED APPLICATIONS

This application claims benefit of U.S. provisional patent application Ser. No. 61/887,046, filed Oct. 4, 2013, which is herein incorporated by reference.

FIELD

Embodiments of the present disclosure generally relate to a semiconductor fabrication processes.

BACKGROUND

Conventional processes utilized to form features in a substrate, for example, high aspect ratio features, typically include the use of a polymer forming gas (e.g., carbon tetrafluoride ($CF_4$)) in combination with a provision of a pulsed bias power. However the inventors have observed that such processes typically do not provide sufficient control over the dimensions of the features formed, resulting in non-uniform feature profiles.

Therefore, the inventors have provided improved methods for forming features in a silicon containing layer

SUMMARY

Embodiments of methods for forming features in a silicon containing layer of a substrate disposed on a substrate support are provided herein. In some embodiments, a method for forming features in a silicon containing layer of a substrate disposed on a substrate support in a processing volume of a process chamber includes: exposing the substrate to a first plasma formed from a first process gas while providing a bias power to the substrate support, wherein the first process gas comprises one or more of a chlorine-containing gas or a bromine containing gas; and exposing the substrate to a second plasma formed from a second process gas while no bias power is provided to the substrate support, wherein the second process gas comprises one or more of an oxygen-containing gas or nitrogen gas, and wherein a source power provided to form the first plasma and the second plasma is continuously provided.

In some embodiments, a method for forming features in a silicon containing layer of a substrate having a patterned layer disposed atop the silicon containing layer to define one or more features to be etched into the silicon containing layer, wherein the substrate is disposed on a substrate support in a processing volume of a process chamber, includes: a) exposing the substrate to a first plasma formed from a first process gas while providing about 150 to about 350 W of a bias power to the substrate support, wherein the first process gas comprises one or more of a chlorine-containing gas or a bromine containing gas, b) exposing the substrate to a second plasma formed from a second process gas while no bias power is provided to the substrate support, wherein the second process gas comprises one or more of an oxygen-containing gas or nitrogen gas, and wherein a source power provided to form the first plasma and the second plasma is continuously provided; and c) filling the features with silicon oxide to form one or more shallow trench isolation structures.

In some embodiments, a computer readable medium is provided having instructions stored thereon that, when executed, cause a method for forming features in a silicon containing layer of a substrate disposed on a substrate support in a processing volume of a process chamber. The method can be any of the embodiments described herein.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

Figure 1:
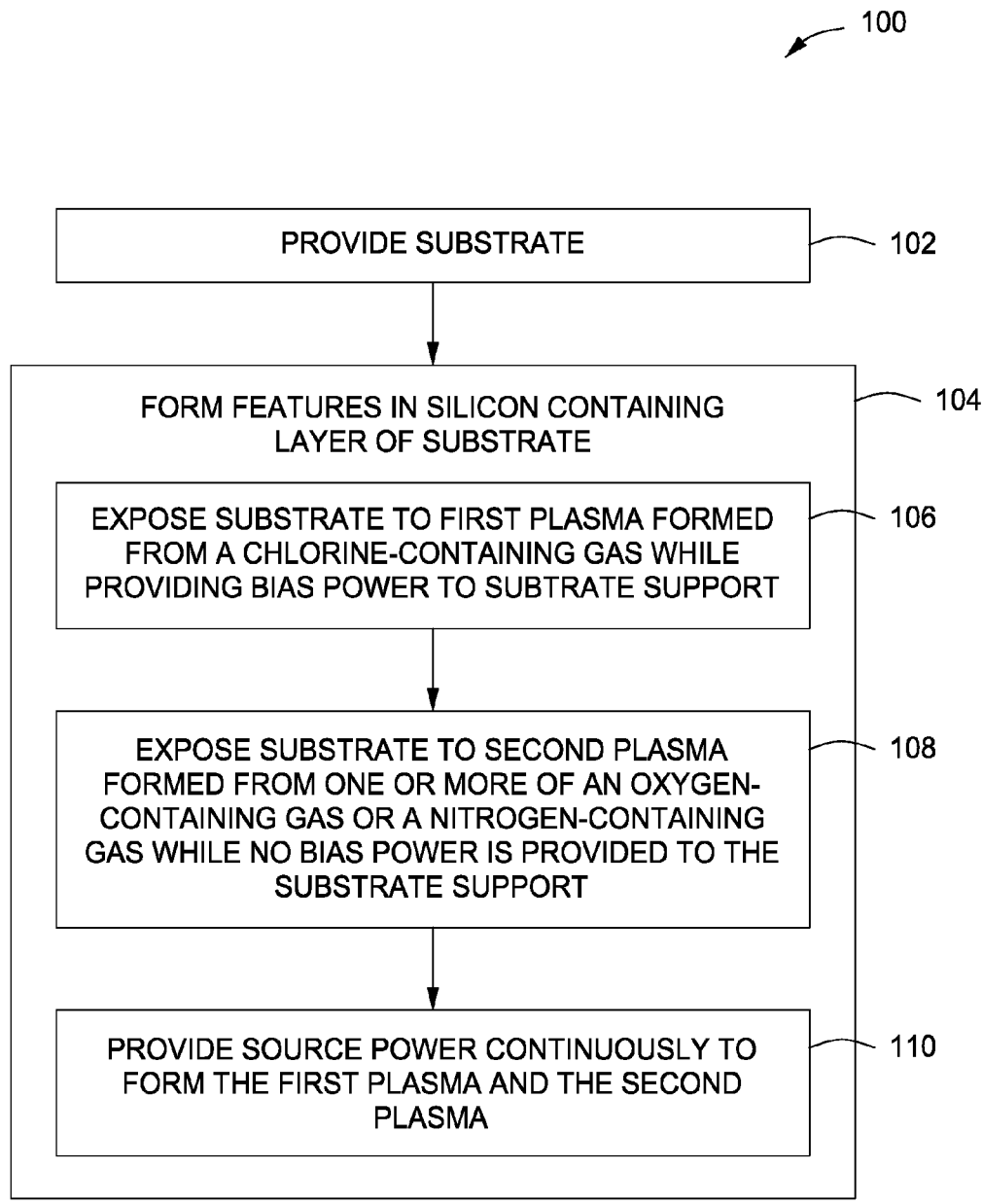
FIG. 1 depicts a method for forming features in a silicon containing layer of a substrate disposed on a substrate support, in accordance with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of methods for forming features in a silicon containing layer of a substrate disposed on a substrate support are provided herein. In at least some embodiments, the inventive methods may advantageously facilitate fabricating features (e.g., trenches and/or vias, for example, for the fabrication of shallow trench isolation (STI) structures) having an improved control of feature profile, critical dimension, and/or microloading between individual features, between features and peripheral areas, and/or between regions of dense features and regions of isolated features, as compared to conventionally utilized processes to form such features. While not intending to be limiting in scope, the inventors have observed that the inventive methods described herein may be particularly advantageous in the fabrication of high aspect ratio (HAR) features. As used herein, a high aspect ratio feature may be a feature having a height to width ratio of greater than about 5:1. For example, embodiments of the present disclosure may be used in the fabrication of features having aspect ratios of up to about 40:1. While further not intending to be limiting in scope, the inventors have observed that the inventive methods described herein may be particularly advantageous in the fabrication of features in sub-20 nm device node applications.

Figure 2A:
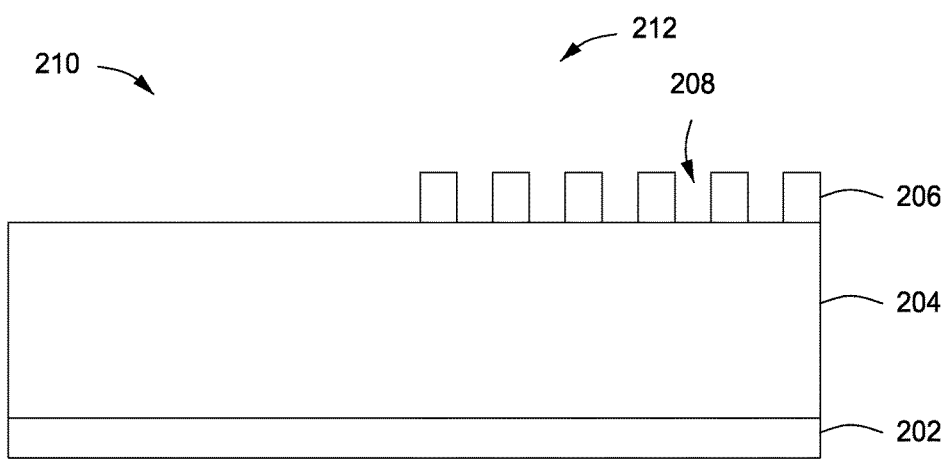
FIGS. 2A-B are illustrative cross-sectional views of a substrate during different stages of the method of FIG. 1 in accordance with some embodiments of the present disclosure.
Figure 2B:
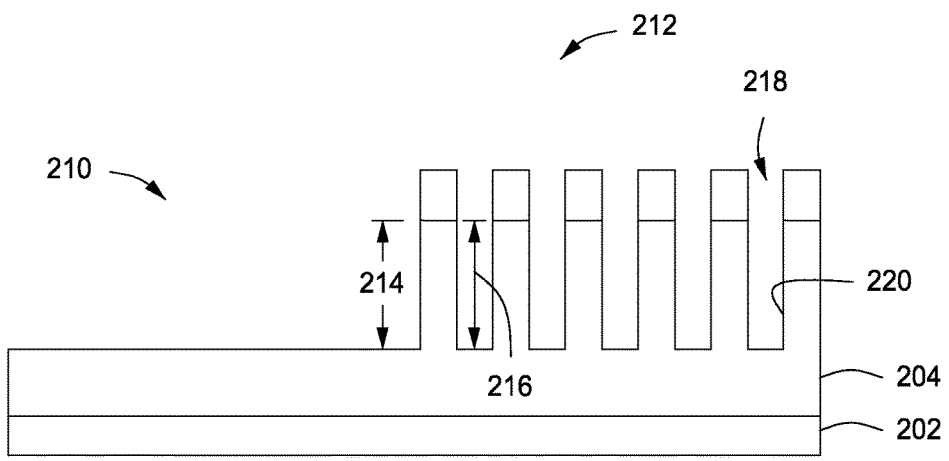

FIG. 1 is a flow diagram of a method 100 for forming features in a silicon containing layer of a substrate in accordance with some embodiments of the present disclosure. FIGS. 2A-B are illustrative cross-sectional views of a substrate during different stages of the method of FIG. 1 in accordance with some embodiments of the present disclosure. The above method may be performed in any apparatus suitable for processing semiconductor substrates in accordance with embodiments of the present disclosure, such as discussed below with respect to FIG. 4.

The method 100 generally begins at 102 where a substrate 202 having a silicon containing layer 204 is provided, as depicted in FIG. 2A. The substrate 202 may be any suitable substrate, such as a doped or un-doped silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a light emitting diode (LED) substrate, a solar cell array, solar panel, or the like. In some embodiments, the substrate 202 may be a semiconductor wafer.

The silicon containing layer 204 may comprise any silicon containing materials suitable for fabricating a desired semiconductor device. For example, in some embodiments, the silicon containing layer 204 may comprise at least one of silicon (Si), silicon oxide ($SiO_2$), silicon nitride (SiN), or the like.

In some embodiments, a patterned layer 206 may be disposed atop the silicon containing layer 204 to define one or more features 208 to be etched into the silicon containing layer 204. In addition, the patterned layer 206 may define separate regions of varying feature density. For example, as depicted in FIG. 2A, the patterned layer 206 may define one or more areas of high feature density 212 and one or more areas of low feature density 210. The patterned layer 206 may also define features having varying aspect ratios.

The patterned layer 206 may be any suitable layer sufficient function as a template to define the one or more features 208, such as a hard mask or photoresist layer. For example, in embodiments where the patterned layer 206 is a hard mask, the patterned layer 206 may comprise at least one of oxides, such as silicon dioxide ($SiO_2$), silicon oxynitride (SiON), or the like, or nitrides, such as titanium nitride (TiN), silicon nitride (SiN), or the like, silicides, such as titanium silicide (TiSi), nickel silicide (NiSi) or the like, or silicates, such as aluminum silicate (AlSiO), zirconium silicate (ZrSiO), hafnium silicate (HfSiO), or the like. Alternatively, or in combination, in some embodiments, the mask layer may comprise an amorphous carbon, such as Advanced Patterning Film (APF), available from Applied Materials, Inc., located in Santa Clara, Calif., or a tri-layer resist (e.g., a photoresist layer, a Si-rich anti-reflective coating (ARC) layer, and a carbon-rich ARC, or bottom ARC (BARC) layer), a spin-on hardmask (SOH), or the like. The patterned layer 206 may be formed by any process suitable to form a patterned layer 206 capable of providing an adequate template for defining the one or more features 208. For example, in some embodiments, the patterned layer 206 may be formed via a patterned etch process. In some embodiments, for example where the patterned layer 206 will be utilized to define advanced or very small node devices (e.g., about 40 nm or smaller nodes, such as Flash memory devices), the patterned layer 206 may be formed via a spacer mask patterning technique, such as a self-aligned double patterning process (SADP).

Next, at 104, one or more features 218 may be formed in silicon containing layer 204, such as shown in FIG. 2B. To form the one or more features at 104, first, at 106, the substrate 202 may be exposed to a first plasma formed from a first process gas comprising at least one of a chlorine containing gas or a bromine containing gas while providing a bias power to a substrate support (e.g., substrate support 416 described below) supporting the substrate 202. Exposing the substrate 202 to the plasma formed from the first process gas facilitates a removal (e.g., etching) of material from the silicon containing layer 204, to at least partially form the one or more features 218 in the silicon containing layer 204. The inventors have observed that utilizing a chlorine or bromine containing gas provides an improved control over a profile of the features as compared to, for example, features formed via conventional etch processes that utilize mainly a fluorine containing gas such as carbon tetrafluoride ($CF_4$), or the like. However, in some embodiments, a fluorine containing gas such as carbon tetrafluoride ($CF_4$) may be provided in addition to the chlorine or bromine containing gas.

The chlorine or bromine containing gas may comprise any chlorine or bromine containing gas suitable to facilitate etching the silicon containing layer 204. For example, in some embodiments, the chlorine containing gas may comprise chlorine ($Cl_2$) gas, hydrogen chloride (HCl), silicon tetrachloride ($SiCl_4$), or the like. In some embodiments, the bromine containing gas may comprise hydrogen bromide (HBr) or the like. The chlorine or bromine containing gas may be provided at any flow rate suitable to provide a sufficient amount of chlorine to facilitate etching the silicon containing layer 204. For example, in some embodiments, the chlorine containing gas may be provided at a flow rate of about 50 to about 1000 sccm. In some embodiments, the bromine containing gas may be provided at a flow rate of about 10 to about 500 sccm.

In some embodiments, the first process gas may further include an oxygen containing gas and/or nitrogen gas ($N_2$). By providing the oxygen containing gas and/or nitrogen gas, the inventors have observed that the oxygen containing gas and/or nitrogen gas may at least partially oxidize and/or nitride a sidewall 220 of the one or more features 218, advantageously resulting in a reduction of a lateral etch of the silicon containing layer 204 and, thus, providing a uniform feature profile. In some embodiments, the oxygen containing gas includes only oxygen, and optionally one or more of carbon and sulfur. Examples of suitable oxygen containing gases include oxygen ($O_2$) gas, carbon monoxide (CO), carbonyl sulfide (COS), sulfur dioxide ($SO_2$), or the like.

The oxygen containing gas and/or nitrogen gas may be provided at any flow rate suitable to oxidize or nitride a desired portion of the silicon containing layer 204. For example, in some embodiments, the oxygen containing gas may be provided at a flow rate of up to about 100 sccm. In some embodiments, the nitrogen gas may be provided at a flow rate of up to about 100 sccm.

In some embodiments, the first process gas may further include a dilutant gas or carrier gas. The dilutant gas or carrier gas may be any inert gas, such as helium (He), argon (Ar), or the like. In some embodiments, the dilutant gas may be provided at a flow rate of up to about 500 sccm.

Non limiting examples of the first process gas include hydrogen bromide, chlorine, oxygen, nitrogen, and either helium or argon provided at a flow rate ratio of $HBr:Cl_2:O_2:N_2:$(He or Ar)=40:40:1:10:30, hydrogen bromide, carbon tetrafluoride, oxygen, nitrogen, and either helium or argon provided at a flow rate ratio of $HBr:CF_4:O_2:N_2:$(He or Ar)=40:40:1:10:30, chlorine, oxygen, and either helium or argon provided at a flow rate ratio of $Cl_2:O_2:$(He or Ar)=50:1:40, chlorine, either helium or argon, and oxygen provided at a flow rate of $Cl_2$:(He or Ar):$O_2$=70:70:1, and hydrogen bromide, carbon tetrafluoride, and either helium or argon provided at a flow rate of $HBr$:$CF_4$:(He or Ar)=10:1:20. In any of the preceding ratios, the amount of gas provided can be plus or minus about 50% by volume of the given flow rate ratio.

To form the plasma, the first process gas may be ignited into a plasma by coupling a source power (e.g., an RF power) to the process gas within a process chamber under suitable conditions to establish the plasma. For example, in some embodiments, a plasma power source of about 200 to about 300 W, at a frequency in a range from about 50 KHz to about 13.56 MHz may be coupled to the process gas. In some embodiments, the source power may be provided continuously (e.g., not pulsed) while forming the features 218 in the silicon containing layer 204 (e.g., as shown at 110).

Additional process parameters may be utilized to promote plasma ignition and stability. For example, in some embodiments, the process chamber may be maintained at a temperature of about 10 to about 200 degrees Celsius during plasma ignition and processing. Additionally, in some embodiments, the process chamber may be maintained at a pressure of between about 3 to about 50 mTorr.

Providing bias power while exposing the substrate 202 to the plasma formed from the first process gas advantageously directs ions formed in the plasma towards the substrate 202, causing the ions to bombard the silicon containing layer 204, thus etching the silicon containing layer 204. The bias power may be provided at any magnitude sufficient to facilitate etching of the silicon containing layer 204 while not causing damage to any underlying layers and/or the substrate 202. For example, in some embodiments, about 150 to about 350 W of bias power may be provided to the substrate support while exposing the substrate 202 to the first plasma formed from the first process gas.

Next, at 108, the substrate 202 may be exposed to a second plasma formed from a second process gas comprising one or more of an oxygen containing gas or nitrogen gas ($N_2$) while no bias power is provided to the substrate support. The second process gas is free, or in some embodiments essentially free, of silicon etchant species (e.g., halogens). Exposing the substrate 202 to a plasma (e.g., the second plasma) formed from an oxygen containing gas or nitrogen gas while not providing bias advantageously at least partially oxidizes and/or nitrides the sidewall 220 of the one or more features 218, with limited oxidation and/or nitridation on the bottom of the one or more features 218. By oxidizing or nitriding the sidewall 220 of the one or more features 218, a protective layer may be formed on the sidewall 220 of the one or more features 218, advantageously reducing a lateral etch of the silicon containing layer 204, thus producing a smooth and uniform feature profile. In addition, exposing the substrate 202 to the second plasma while not providing a bias power reduces bombardment of the substrate 202 by ions formed in the second plasma, advantageously reducing or eliminating damage caused to the substrate 202 and/or silicon containing layer 204 and reducing or eliminating oxidation or nitridation of the bottom of the one or more features 218 while allowing the sidewall 220 of the features 218 to be oxidized or nitrided.

The oxygen containing gas may comprise any oxygen containing gas suitable to facilitate oxidizing the sidewall 220 of the one or more features 218, as described above. In some embodiments, the oxygen containing gas includes only oxygen, and optionally one or more of carbon and sulfur. For example, in some embodiments, the oxygen containing gas may comprise oxygen ($O_2$) gas, carbon monoxide (CO), carbonyl sulfide (COS), sulfur dioxide ($SO_2$), or the like. The oxygen containing gas may be provided at any flow rate suitable to provide a sufficient amount of oxygen to facilitate oxidizing the sidewall 220 of the one or more features 218. For example, in some embodiments, the oxygen containing gas may be provided at a flow rate of about 30 to about 300 sccm.

The nitrogen gas ($N_2$) may be provided at any flow rate suitable to provide a sufficient amount of nitrogen to facilitate nitriding the sidewall 220 of the one or more features 218. For example, in some embodiments, the nitrogen gas may be provided at a flow rate of about 30 to about 300 sccm.

In some embodiments, a dilutant gas or carrier gas may be provided with the oxygen containing gas and/or the nitrogen gas. The dilutant gas or carrier gas may be any inert gas, such as helium (He), argon (Ar), or the like. In some embodiments, the dilutant gas may be provided at a flow rate of up to about 500 sccm.

To form the second plasma, the process gas may be ignited into a plasma by coupling a source power (e.g., an RF power) to the process gas within a process chamber under suitable conditions to establish the plasma. For example, in some embodiments, a plasma power source of about 200 to about 300 W, at a frequency in a range from about 50 KHz to about 13.56 MHz may be coupled to the process gas. In some embodiments, the source power may be provided continuously (e.g., not pulsed) while forming the features 218 in the silicon containing layer 204 (e.g., as shown at 110).

Additional process parameters may be utilized to promote plasma ignition and stability. For example, in some embodiments, the process chamber may be maintained at a temperature of about 10 to about 200 degrees Celsius during plasma ignition. Additionally, in some embodiments, the process chamber may be maintained at a pressure of about 3 to about 50 mTorr.

The above-described exposing the substrate to the first plasma and the second plasma may be repeated to etch the features to the desired depth. In some embodiments, the first process gas, second process gas, and bias power may be provided in pulses. By pulsing each of the first process gas, second process gas, and bias power, the inventors have observed that one or more dimensions (e.g., a depth or width) of the one or more features may advantageously be better controlled. For example, etch depth microloading between individual one or more features 208 and between the regions of high feature density 212 and the regions of low feature density 210 can be more tightly controlled.

Figure 3:
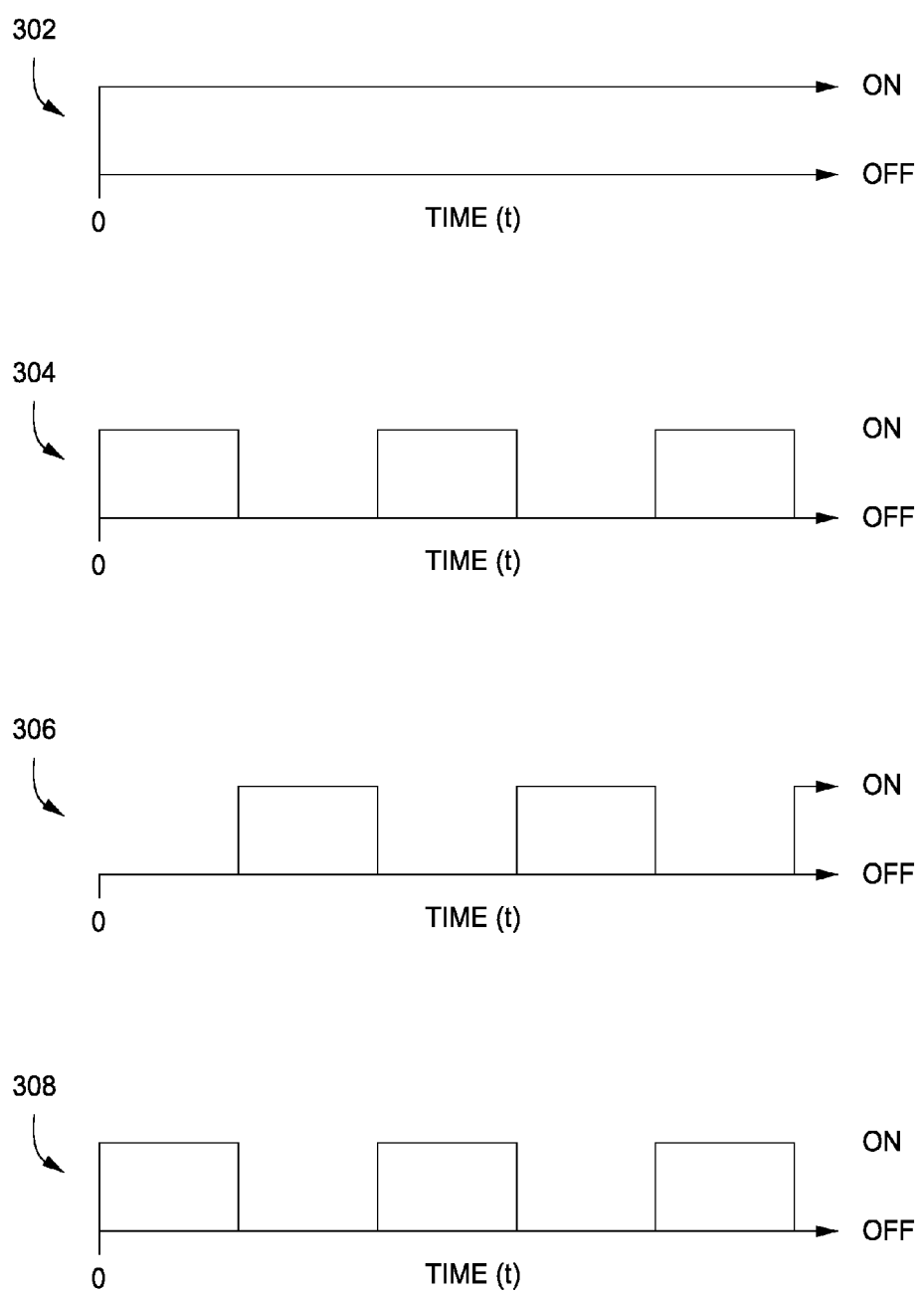
FIG. 3 is a pulsing diagram suitable for performing portions of the method of FIG. 1 in accordance with some embodiments of the present disclosure.

For example, referring to FIG. 3, in some embodiments, the source power (e.g. the RF power described above) may be provided continuously (e.g., a constant "on" state), while forming the one or more features 208 at 104, such as shown at 302. While the source power is continuously provided, the provision of the first process gas and bias power (at 106) and the provision of the second process gas (at 108) may be alternately pulsed for a plurality of iterations. For example, while the bias power (shown at 304) is provided, the first process gas (shown at 308) is also provided, and the second process gas (shown at 306) is not provided.

The pulsing condition, (e.g., the duty cycle or pulse frequency) of the bias power, the first process gas and the second process gas may be varied to facilitate control over the dimensions of the one or more features 218. For example, in some embodiments the duty cycle of one or more of the bias power, the first process gas, and the second process gas may be about 10 to about 90 percent, at a pulse frequency of about 10 Hz to about 20 kHz.

Upon completion of etching the substrate 202 to form one or more features (such as STI structure recesses 214, 216) at 108, the process generally ends and the substrate may continue to be processes as desired. For example, the STI structure recesses 214, 216 may be filled with an appropriate material, such as silicon oxide, to form one or more STI structures.

Figure 4:
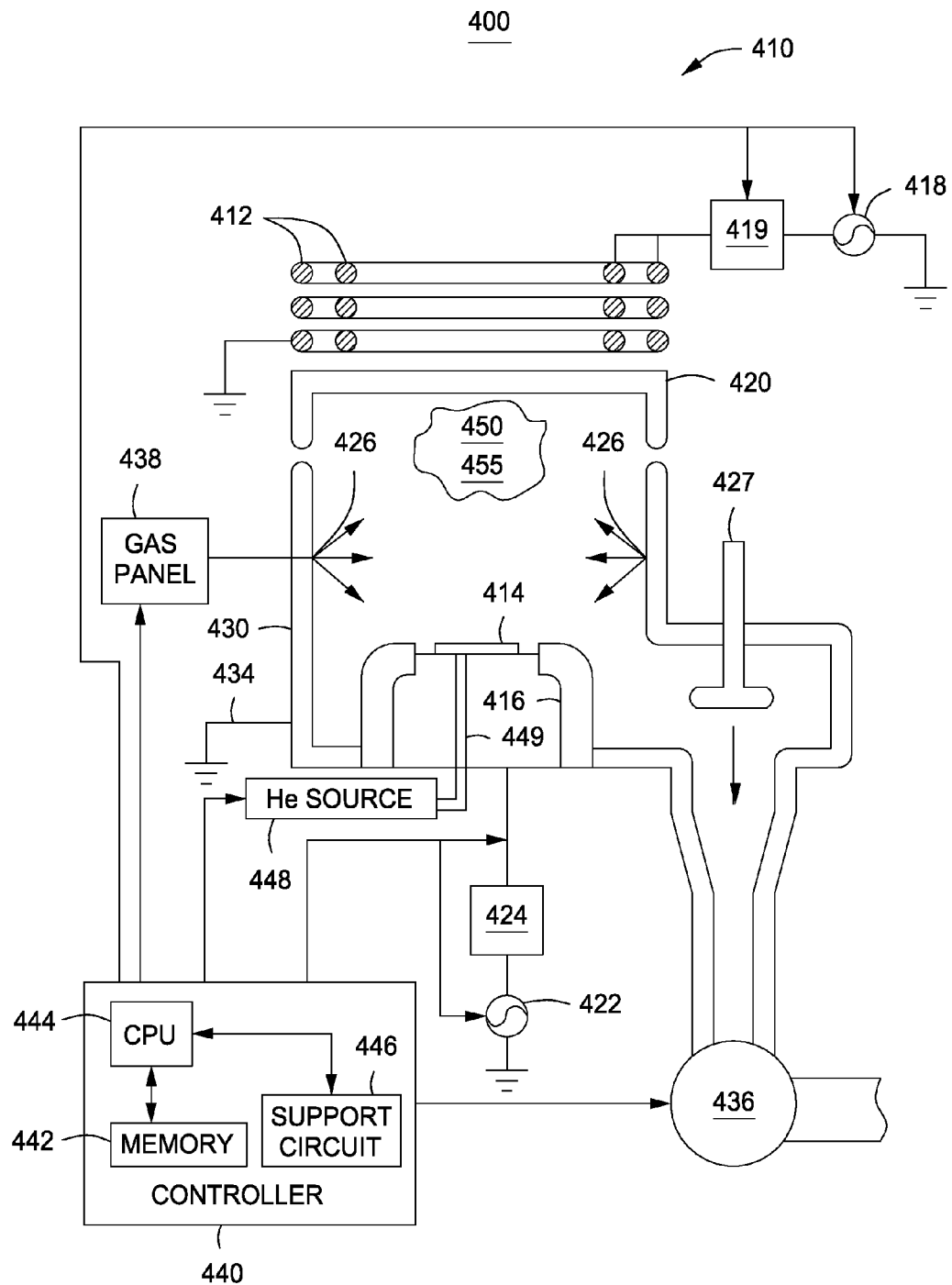
FIG. 4 depicts a process chamber suitable to perform the method of FIG. 1 in accordance with some embodiments of the present disclosure.

FIG. 4 depicts a schematic diagram of an illustrative etch reactor 400 of the kind that may be used to practice embodiments of the disclosure as discussed herein. The etch reactor 400 may be utilized alone or, more typically, as a processing module of an integrated semiconductor substrate processing system, or cluster tool, such as a CENTURA® integrated semiconductor substrate processing system, available from Applied Materials, Inc. of Santa Clara, Calif. Examples of suitable etch reactors 400 include the ADVANTEDGE™ line of etch reactors (such as the AdvantEdge G3 or the AdvantEdge G5), the DPS® line of etch reactors (such as the DPS®, DPS® II, DPS® AE, DPS® HT, DPS® G3 poly etcher), or other etch reactors, also available from Applied Materials, Inc. Other etch reactors and/or cluster tools may suitably be used as well.

The etch reactor 400 comprises a chamber 410 having a substrate support 416 (cathode) within a conductive body (wall 430), and a controller 440. The chamber 410 may be supplied with a substantially flat dielectric ceiling (ceiling 420). Alternatively, the chamber 410 may have other types of ceilings, e.g., a dome-shaped ceiling. An antenna comprising at least one inductive coil element 412 is disposed above the ceiling 420 (two co-axial inductive coil elements 412 are shown). The inductive coil element 412 is coupled to a plasma power source 418 through a first matching network 419. The plasma power source 418 typically is capable of producing up to 3000 W at a tunable frequency in a range from about 50 KHz to about 13.56 MHz. The plasma power source 418 may be operable in a continuous wave (CW) or pulsed mode. When in pulse mode, the plasma power source 418 may be pulsed at a pulse frequency of up to about 100 KHz, or in some embodiments, between about 100 Hz to about 100 KHz. The plasma power source 418 may be operated at a duty cycle (e.g., the percentage of on time during the total of on time and off time in a given cycle) of between about 10% and about 90%.

The substrate support 416 is coupled, through a second matching network 424, to a biasing power source 422. The biasing power source 422 generally is capable of producing up to 1500 W at a frequency of approximately 13.56 MHz. The biasing power may be either continuous or pulsed power. In other embodiments, the biasing power source 422 may be a DC or pulsed DC source. The biasing power source 422 may be operable in a continuous wave (CW) or pulsed mode. When in pulse mode, the biasing power source 422 may be pulsed at a pulse frequency of up to about 100 kHz, or in some embodiments, between about 100 Hz to about 100 KHz. The biasing power source 422 may be operated at a duty cycle (e.g., the percentage of on time during the total of on time and off time in a given cycle) of between about 10% and about 90%.

A controller 440 comprises a central processing unit (CPU) 444, a memory 442, and support circuits 446 for the CPU 444 and facilitates control of the components of the chamber 410 and, as such, of the etch process, as discussed below in further detail.

In operation, a substrate 414 is placed on the substrate support 416 and process gases are supplied from a gas panel 438 through entry ports 426 and form a gaseous mixture 450. The gaseous mixture 450 is ignited into a plasma 455 in the chamber 410 by applying power from the plasma power source 418 and biasing power source 422 to the inductive coil element 412 and the cathode (substrate support 416), respectively. The pressure within the interior of the chamber 410 is controlled using a throttle valve 427 and a vacuum pump 436. Typically, the wall 430 is coupled to an electrical ground 434. The temperature of the wall 430 is controlled using liquid-containing conduits (not shown) that run through the wall 430.

The temperature of the substrate 414 is controlled by stabilizing a temperature of the substrate support 416. In one embodiment, the helium gas from a gas source 448 is provided via a gas conduit 449 to channels (not shown) formed in the pedestal surface under the substrate 414. The helium gas is used to facilitate heat transfer between the substrate support 416 and the substrate 414. During processing, the substrate support 416 may be heated by a resistive heater (not shown) within the pedestal to a steady state temperature and then the helium gas facilitates uniform heating of the substrate 414. Using such thermal control, the substrate 414 may be maintained at a temperature of between about 0-650 degrees Celsius.

Other etch chambers may be used to practice the disclosure, including chambers with remote plasma sources, electron cyclotron resonance (ECR) plasma chambers, and the like.

To facilitate control of the process chamber 410 as described above, the controller 440 may be one of any form of general-purpose computer processor that can be used in an industrial setting for controlling various chambers and sub-processors. The memory 442, or computer-readable medium, of the CPU 444 may be one or more of readily available memory such as random access memory (RAM), read only memory (ROM), floppy disk, hard disk, or any other form of digital storage, local or remote. The support circuits 446 are coupled to the CPU 444 for supporting the processor in a conventional manner. These circuits include cache, power supplies, clock circuits, input/output circuitry and subsystems, and the like. The inventive method described herein is generally stored in the memory 442 as a software routine. The software routine may also be stored and/or executed by a second CPU (not shown) that is remotely located from the hardware being controlled by the CPU 444.

Thus, embodiments of methods for forming features in a silicon containing layer of a substrate disposed on a substrate support have been provided herein. In at least some embodiments, the inventive methods may advantageously facilitate fabricating features (e.g., trenches and/or vias for the fabrication of shallow trench isolation (STI) structures) having an improved control of dimensions of the formed features, as compared to conventionally utilized processes to form such features.

While the foregoing is directed to embodiments of the present disclosure, other and further embodiments of the disclosure may be devised without departing from the basic scope thereof.

The invention claimed is:

1. A method for forming features in a silicon containing layer of a substrate having a patterned layer disposed atop the silicon containing layer to define one or more features to be etched into the silicon containing layer, the method comprising:

a) exposing the substrate to a first plasma formed from a first process gas while providing a bias power to a substrate support supporting the substrate, wherein the first process gas comprises one or more of a chlorine-containing gas or a bromine containing gas; and b) exposing the substrate to a second plasma formed from a second process gas while no bias power is provided to the substrate support to oxidize and/or nitridize sidewalls of the one or more features with limited oxidation and/or nitridation on a bottom of the one or more features, wherein the second process gas comprises one or more of an oxygen-containing gas or nitrogen gas, and wherein a source power provided to form the first plasma and the second plasma is continuously provided while exposing the substrate to the first plasma and up to and including while exposing the substrate to the second plasma.

2. The method of claim 1, wherein the silicon containing layer comprises at least one of silicon (Si), silicon oxide ($SiO_2$), or silicon nitride (SiN).

3. The method of claim 1, wherein the patterned layer defines separate regions of varying feature density.

4. The method of claim 1, wherein the first process gas includes the chlorine containing gas, and wherein the chlorine containing gas comprises chlorine ($Cl_2$) gas, hydrogen chloride (HCl), or silicon tetrachloride ($SiCl_4$).

5. The method of claim 1, wherein the first process gas includes the bromine containing gas, and wherein the bromine containing gas is hydrogen bromide (HBr).

6. The method of claim 1, wherein the first process gas further comprises one or more of an oxygen containing gas or nitrogen gas ($N_2$).

7. The method of claim 1, wherein the first process gas further comprises an oxygen containing gas, and wherein the oxygen containing gas is one or more of oxygen gas ($O_2$), carbon monoxide (CO), carbonyl sulfide (COS), or sulfur dioxide ($SO_2$).

8. The method of claim 1, wherein at least one of the first process gas and the second process gas further comprises an inert carrier gas.

9. The method of claim 1, wherein the first process gas consists essentially of one of:
   hydrogen bromide, chlorine, oxygen, nitrogen, and either helium or argon;
   hydrogen bromide, carbon tetrafluoride, oxygen, nitrogen, and either helium or argon;
   chlorine, oxygen, and either helium or argon; or
   hydrogen bromide, carbon tetrafluoride, and either helium or argon.

10. The method of claim 1, wherein about 150 to about 350 W of bias power is provided to the substrate support while exposing the substrate to the first plasma formed from the first process gas.

11. The method of claim 1, wherein second process gas is free of silicon etchant species.

12. The method of claim 1, wherein the oxygen containing gas includes only oxygen, and optionally one or more of carbon and sulfur.

13. The method of claim 12, wherein the oxygen containing gas is one or more of oxygen gas ($O_2$), carbon monoxide (CO), carbonyl sulfide (COS), or sulfur dioxide ($SO_2$).

14. The method of claim 1, wherein while the source power is continuously provided, the provision of the first process gas and bias power and the provision of the second process gas are alternately pulsed for a plurality of iterations.

15. The method of claim 14, wherein the alternate pulsing is provided at a duty cycle of about 10 to about 90 percent.

16. The method of claim 14, wherein the alternate pulsing is provided at a pulse frequency of about 10 Hz to about 20 kHz.

17. The method of claim 1, wherein the first process gas and the second process gas are ignited into a plasma by provision of a plasma power source of about 200 to about 300 W at a frequency in a range from about 50 KHz to about 13.56 MHz.

18. The method of claim 1, further comprising:
   filling the features with silicon oxide to form one or more shallow trench isolation structures.

19. A method for forming features in a silicon containing layer of a substrate having a patterned layer disposed atop the silicon containing layer to define one or more features to be etched into the silicon containing layer, the method comprising:
   a) exposing the substrate to a first plasma formed from a first process gas while providing a bias power to a substrate support supporting the substrate, wherein the first process gas comprises one or more of a chlorine-containing gas or a bromine containing gas and not a fluorine-containing gas;
   b) exposing the substrate to a second plasma formed from a second process gas while no bias power is provided to the substrate support to oxidize and/or nitridize sidewalls of the one or more features with limited oxidation and/or nitridation on a bottom of the one or more features, wherein the second process gas comprises one or more of an oxygen-containing gas or nitrogen gas, and wherein a source power provided to form the first plasma and the second plasma is continuously provided; and
   c) filling the features with silicon oxide to form one or more shallow trench isolation structures.

20. A method of forming features in a silicon containing layer of a substrate having a patterned layer disposed atop the silicon containing layer to define one or more features to be etched into the silicon containing layer, wherein the substrate is disposed on a substrate support in a processing volume of a process chamber, the method comprising:
   a) exposing the substrate to a first plasma formed from a first process gas while providing a bias power to the substrate support, wherein the first process gas comprises one or more of a chlorine-containing gas or a bromine containing gas; and
   b) oxidizing and/or nitriding a sidewall of the one or more features with limited oxidation and/or nitridation on a bottom of the one or more features by exposing the substrate to a second plasma formed from a second process gas while no bias power is provided to the substrate support, wherein the second process gas comprises one or more of an oxygen-containing gas or nitrogen gas, and wherein a source power provided to form the first plasma and the second plasma is continuously provided.

* * * * *